(12) United States Patent
Lee et al.

(10) Patent No.: US 7,138,327 B2
(45) Date of Patent: Nov. 21, 2006

(54) METHOD OF ROUTING AN ELECTRICAL CONNECTION ON A SEMICONDUCTOR DEVICE AND STRUCTURE THEREFOR

(75) Inventors: Hun Kwang Lee, Penang (MY); Ing Hong Ooi, Selangor D.E. (MY)

(73) Assignee: Semiconductor Components Industries, LLC, Phoenix, AZ (US)

( * ) Notice: Subject to any disclaimer, the term of this patent is extended or adjusted under 35 U.S.C. 154(b) by 131 days.

(21) Appl. No.: 10/860,613

(22) Filed: Jun. 4, 2004

(65) Prior Publication Data

US 2005/0208747 A1 Sep. 22, 2005

(30) Foreign Application Priority Data

Mar. 18, 2004 (MY) .............................. PI 2004 0950

(51) Int. Cl.
*H01L 21/44* (2006.01)

(52) U.S. Cl. ..................................................... 438/614
(58) Field of Classification Search ................ 438/614, 438/652

See application file for complete search history.

(56) References Cited

U.S. PATENT DOCUMENTS 4,993,148 A * 2/1991 Adachi et al. ................. 29/832
6,426,289 B1 * 7/2002 Farrar .......................... 438/670

FOREIGN PATENT DOCUMENTS

JP 62290154 A * 12/1987

* cited by examiner

*Primary Examiner*—Lex H. Malsawma
(74) *Attorney, Agent, or Firm*—Robert F. Hightower

(57) ABSTRACT

In one embodiment, conductors of a semiconductor device are routed to a contact platform of the semiconductor device by using electroless plating and screen-printing techniques.

10 Claims, 7 Drawing Sheets

METHOD OF ROUTING AN ELECTRICAL CONNECTION ON A SEMICONDUCTOR DEVICE AND STRUCTURE THEREFOR

BACKGROUND OF THE INVENTION

The present invention relates, in general, to electronics, and more particularly, to semiconductor devices and methods of forming semiconductor devices.

In the past, the semiconductor industry utilized various methods and structures to form electrical connections to a semiconductor die or semiconductor device. For example, wire bonding was one technique used to form an electrical connection between a bonding pad on the semiconductor die and an attachment point on a leadframe of a semiconductor package. Typically, the bonding pad was formed in a non-active area of the semiconductor die. Leadless connection techniques, such as solder balls or flip chip techniques, applied spheres or balls of solder to a bonding pad or other type of connection platform of a semiconductor die. The solder balls were thereafter placed in contact with conductors on a printed circuit board or other type of supporting substrate and soldered to the conductors. In some cases, and particularly in leadless applications such as flip chip, connection platforms were formed in an active area of the semiconductor die. Often, it was desirable to route conductors from the connection platform to a different portion of the semiconductor die in order to facilitate forming the leadless or other type of connection to the semiconductor die.

FIG. 1 through FIG. 3 illustrate some steps in a typical prior art method for routing electrical connection from a connection platform 22 to another area of a semiconductor die 20. Typically, a semiconductor substrate 21 had a connection platform 22 formed somewhere on the surface of substrate 21. A passivation dielectric 23 generally was formed on the surface of semiconductor die 20. An interlayer dielectric 24 was formed overlying passivation dielectric 23 and over a portion of platform 22. Semiconductor processing techniques were utilized to form dielectric 23 and to form an opening through dielectric 23 to expose a portion of the surface of platform 22. Thereafter, a plating base metal was sputtered on to the exposed portions of platform 22 to form a base 26 that would be used for a subsequent electro-plating operation. The material used for base 26 was a conductor to facilitate the electro-plating and typically was a multilayer metal such layers of aluminum/nickel-vanadium/copper (Al/NiV/Cu), or titanium-tungsten/copper (TiW/Cu), or may be evaporated chrome/copper. Typically, semiconductor processing techniques were used to form a photo-resist mask, not show, that was used in sputtering or evaporating base 26. As is well know in the art, sputtering or evaporating techniques require equipment and procedures that form a vacuum and operate at high temperatures in order to accomplish the sputtering operation. Such equipment, the maintenance thereof, and the operation thereof are expensive. Thereafter, semiconductor processing techniques were again utilized to form a photoresist layer, not shown, covering layer 26 in addition to forming a mask for subsequent electroplating operation. Then, conductor material, such as copper (Cu) or a nickel-gold (NiAu) alloy was electro-plated through an opening in the mask and onto layer 26 in order to form conductor 27. Thereafter, the photo-resist was removed leaving conductor 27 electro-plated onto base 26. Subsequently, semiconductor processing techniques were again utilized to form a dielectric 29 covering electro-plated conductor 27, and to form an opening through dielectric 29 to expose a portion of conductor 27. Thereafter, semiconductor processing techniques were once again utilized to deposit a conductor material into the opening to form an electrical contact 31 to platform 22. The semiconductor processing techniques, sputtering techniques, and electro-plating operations added additional cost to the semiconductor device. Additionally, the cost of the associated equipment and the maintenance of the equipment also added to the costs of the semiconductor device.

Accordingly, it is desirable to have a method of forming an electrical contact to a semiconductor device that does not require semiconductor processing techniques and equipment, that does not require sputtering, that does not utilize each electro-plating, and that has a low cost.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 1:
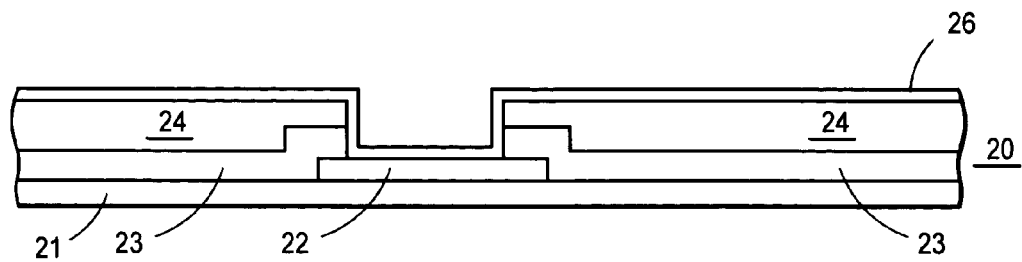
FIG. 1 through FIG. 3 illustrate some steps in a prior art method of routing an electrical conductor for a semiconductor device.
Figure 2:
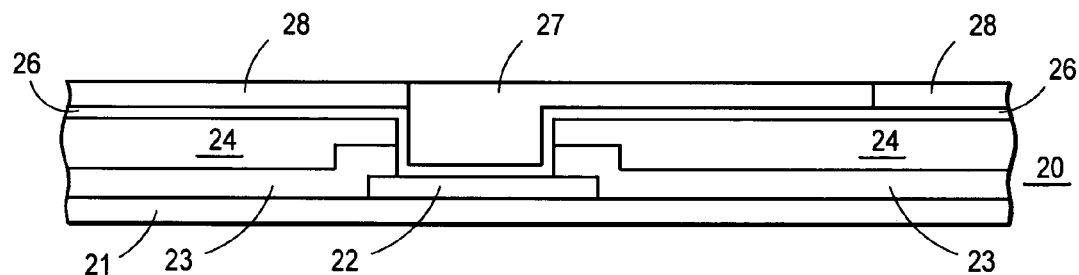
Figure 3:
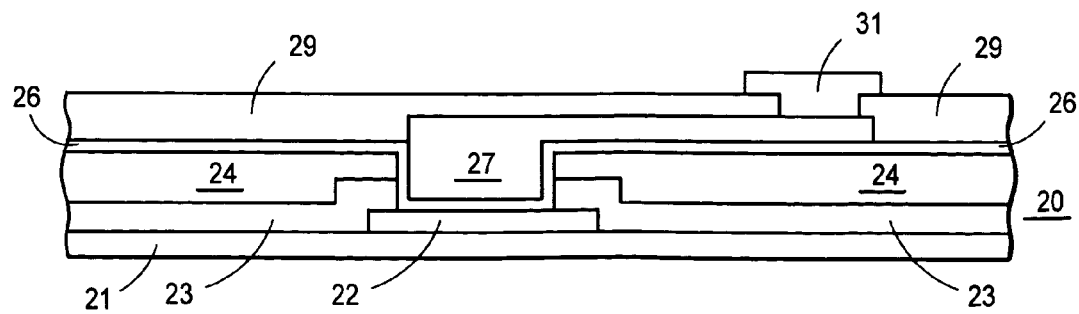
Figure 4:
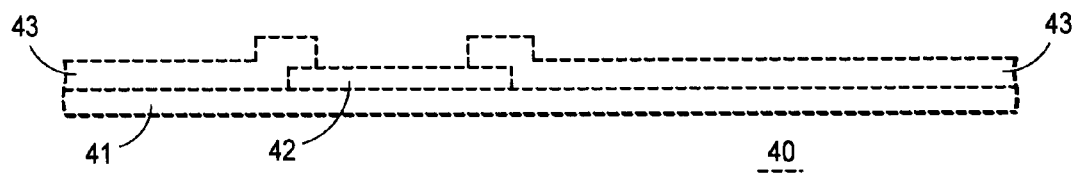
FIG. 4 through FIG. 8 illustrate some steps in an embodiment of a method of forming an electrical contact for a semiconductor device in accordance with the present invention.

FIG. 4 through FIG. 8 illustrates some steps in an embodiment of a method of forming conductor routing for an electrical contact for a semiconductor device 40. This description has references to FIGS. 4–8. Referring now to FIG. 4, a connection platform 42 typically is formed on a semiconductor substrate 41 of device 40. Substrate 41 generally includes various layers of semiconductor materials including active doped regions, inactive regions, and various dielectric layers. Platform 42 generally is aluminum (AL) or an aluminum alloy such as Aluminum-silicon (AlSi) or aluminum-copper (Al—Cu). Typically, a passivation dielectric 43, such as silicon nitride or silicon dioxide or silicon oxynitride is formed on the surface of device 40 to prevent damage to substrate 41. Dielectric 43 often overlaps the edges of platform 42. Methods of forming platform 42 and dielectric 43 are well known to those skilled in the art.

Figure 5:
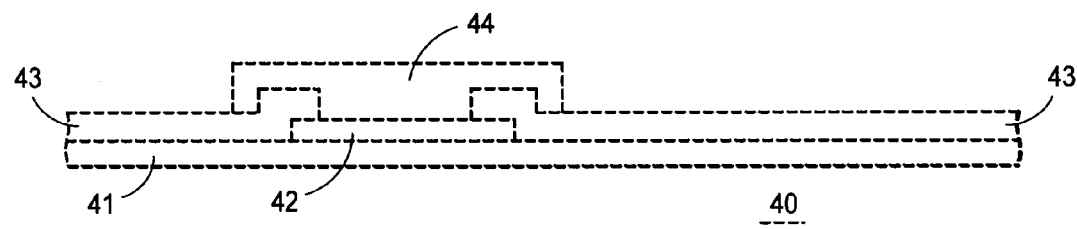

Referring to FIG. 5, in order to route electrical connection to platform 42, an interface connector 44 is formed on connection platform 42 by techniques that do not utilize electro-plating or sputtering and preferably is formed by electroless plating. Connector 44 typically is formed to cover the exposed portions of platform 42 and may extend onto dielectric 43 to ensure that proper electrical connection is formed with platform 42 and to protect the circuitry of device 40 from corrosion. Connector 44 may be any one of a variety of conductors that can be formed by electroless plating including nickel-gold (NiAu), nickel-palladium-gold (NiPdAu), or copper-nickel-gold (CuNiAu). In the preferred embodiment, a wet chemical plating process is used to plate approximately four to six (4–6) and preferably about five (5) microns of nickel onto platform 42 and about 0.02 to 0.08 and preferably 0.08 microns of gold onto the nickel. The material of connector 44 can be applied for example by an electroless nickel (Ni) immersion gold (Au) or an electroless nickel (Ni) electroless palladium (Pd) immersion gold (Au). Such plating process and the chemistry required therefor are well known to those skilled in the art. The electroless plating process causes the material of connector 44 to form on platform 42 and to typically extend an amount onto dielectric 43 that is approximately equal to the thickness of connector 44.

Figure 6:
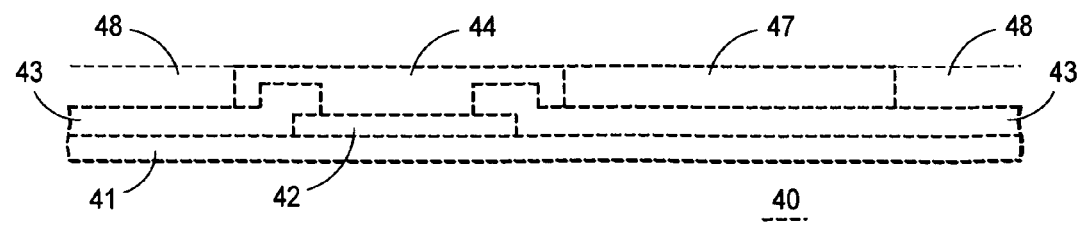

Referring to FIG. 6, a second conductor or routing conductor 47 is formed on dielectric 43 juxtaposed to and in electrical contact with connector 44. Conductor 47 also extends across the semiconductor die of device 40 distally from platform 42 in order to route electrical connection to a different place on the semiconductor die. Conductor 47 is formed with screen-printing or pad-printing techniques that provide a low cost method of applying conductor 47. The conductive material used for conductor 47 is any one of a variety of conductive materials that may be screened-printed or pad-printed such as silver filled epoxy, or copper filled epoxy, or any other conductive polymer material which is electrically conductive and screen or pad printable and that is compatible with electroless plating. In the preferred embodiment conductor 47 is formed from silver filled epoxy. Suitable materials have a viscosity that generally is about six hundred thousand to one million centipoise (600K to 1200K CPS). Examples of suitable materials include materials known in the industry as Ablestik2600BT and Ablestik2815A high conductive epoxy manufactured by Ablestik Laboratories of Rancho Domingue Calif., a division of National Starch and Chemical Company, Inc. ABLESTIK is a trademark of Ablestik Laboratories. A screen-print or pad-print screen 48 that has holes or openings where the conductive material is to be positioned typically is applied to cover device 40, and the conductor material is screen-printed. Such screens and techniques are well-known to those skilled in the art. Screen 48 is illustrated in a general way by dashed lines. In the preferred embodiment, conductor 47 is formed to have a thickness so that the surface of conductor 47 is substantially coplanar to the surface of connector 44. Conductor 47 may also have a length that extends away from the nearest edge of platform 42.

Figure 7:
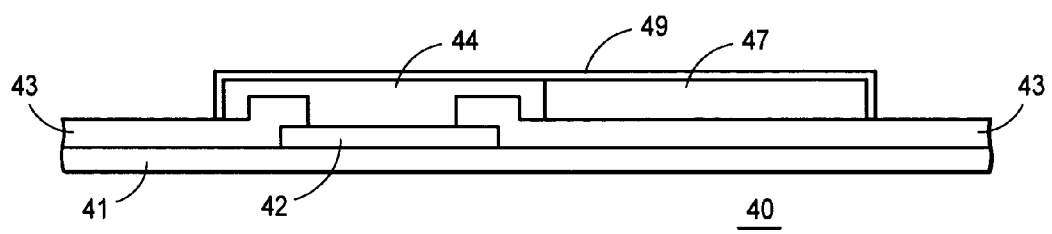

Referring to FIG. 7, thereafter a second conductor or encasing conductor 49 is applied to cover connector 44 and conductor 47. Conductor 49 provides good electrical properties that improve the electrical conductivity of the structure of connector 44 and conductor 47. Preferably conductor 49 completely covers the exposed top and sides connector 44 and conductor 47. Conductor 49 may be any one of a variety of conductors that can be formed by electroless plating including nickel-gold (NiAu), nickel-palladium-gold (NiPdAu), or copper-nickel-gold (CuNiAu). In the preferred embodiment, conductor 49 is the same material and thickness as connector 44 and is applied with the same type of electroless plating process.

Figure 8:
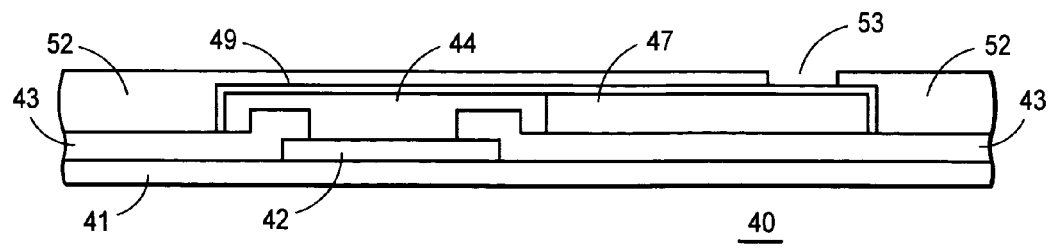

Referring to FIG. 8, an inter-layer dielectric 52 is pad-printed or screened-printed onto dielectric 43 and onto portions of conductor 49. The material used for dielectric 52 generally is a screen-printable non-conductive material that is also suitable for a semiconductor dielectric. Suitable materials for dielectric 52 include polyimide and non-conductive epoxy, and preferably is polyimide. Dielectric 52 and has an opening 53 through which a portion of conductor 49 is exposed in order to provide a means for making electrical contact to conductor 49. Dielectric 52 is formed using screen-printing techniques that are similar to those used to form conductor 47. A screen-printing mask that is similar in composition to screen 48 is used for forming dielectric 52. A conductor generally is formed in opening 53 and extending onto dielectric 52 in order to provide electrical contact to conductor 49 and to provide an attachment pad for forming electrical contact between device 40 and an external platform such as a semiconductor package using wire bonding techniques or a printed circuit board using solder balls or flip chip attachment techniques.

FIG. 9 through FIG. 13 illustrates some of the steps in an alternate embodiment of a method of forming connections for routing for an electrical contact for a semiconductor device 60. This description has references to FIGS. 9–13. In some embodiments, it is desirable to have a stress relief layer between the semiconductor die of device 60 and the conductors that route the electrical connection to platform 42.

Figure 9:
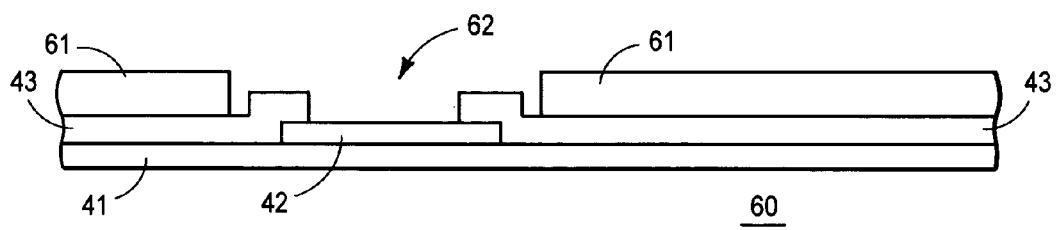
FIG. 9 through FIG. 13 illustrate some steps in an alternate embodiment of a method of forming an electrical contact for a semiconductor device in accordance with the present invention.

Referring now to FIG. 9, in such a case a stress relief layer 61 is formed on dielectric 43 to provide the stress relief. Layer 61 is formed by screen-printing or pad-printing techniques that assist in reducing the cost of device 60. Layer 61 is formed with an opening 62 that exposes the portion of platform 42 and dielectric 43 onto which an interface connector 63 subsequently is to be applied. The material used for layer 61 typically is a material that can be screened-printed or pad-printed and also is a material that has some flexibility to absorb stresses between the semiconductor die of device 60 and the conductors used for routing the electrical connection. Suitable materials for layer 61 include polyimide and other Amide based non-conductive polymers that are screen printable and compatible with semiconductor processing. In the preferred embodiment, layer 61 is polyimide.

Figure 10:
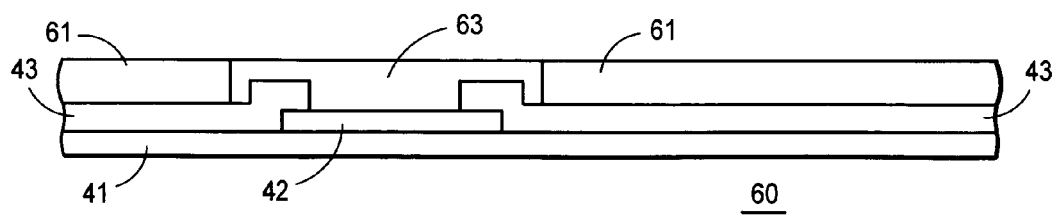

Referring to FIG. 10, a connector 63 that is similar to connector 44 is then formed through opening 62. Connector 63 is formed from materials and by techniques that are the same as those used for forming connector 44. It should be noted that the process could be reversed and that connector 63 could be formed prior to forming layer 61. This could save a masking step.

Figure 11:
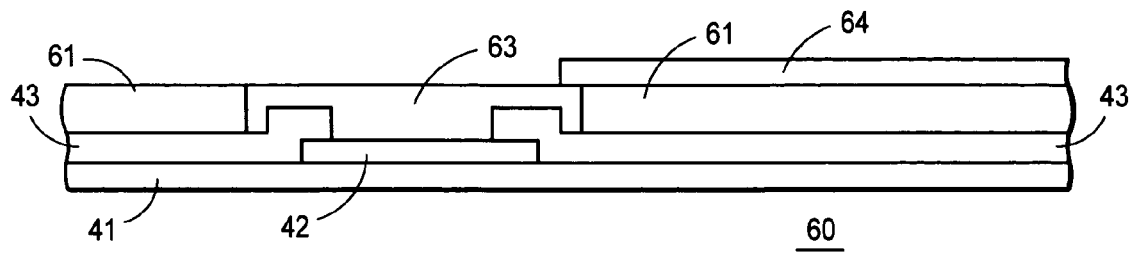

Referring to FIG. 11, a routing conductor 64 is then formed on a portion of connector 63 and on a portion of layer 61 juxtaposed to connector 63 in order to form electrical contact to connector 63. A portion of routing conductor 64 also extends away from connector 63 across the semiconductor die of device 60 in order to route electrical connection from platform 42 and connector 63 to other portions of device 60 similarly to conductor 47. Conductor 64 is formed from materials and by techniques that are the same as those used for forming conductor 47.

Figure 12:
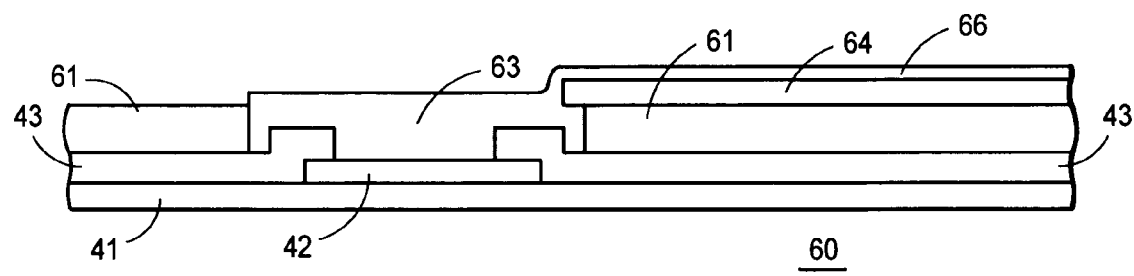

Referring to FIG. 12, thereafter, a protective conductor 66 is formed covering conductor 64 and connector 63. Protective conductor 66 is formed from materials and using techniques that are substantially similar to those used for forming conductor 49. Conductor 66 improves the electrical conduction properties of the structure of conductors 64 and 66.

Figure 13:
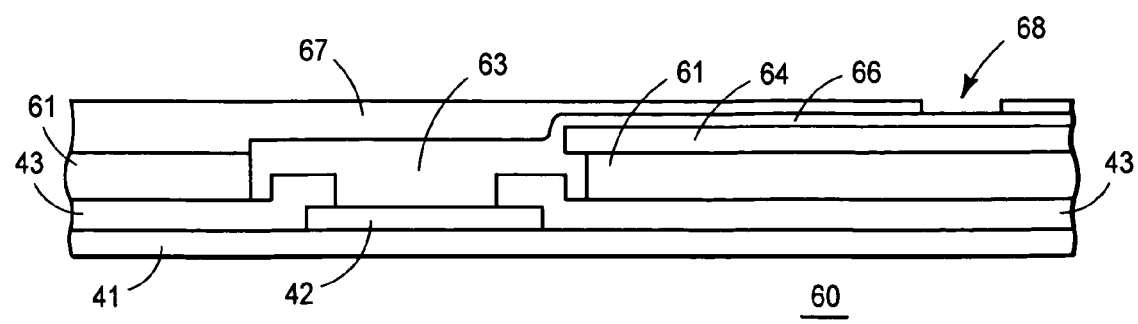

Referring to FIG. 13, an inter-layer dielectric 67 is formed on conductor 66. Dielectric 67 has an opening 68 that exposes the portion of conductor 66 where electrical contact is to be positioned. Dielectric 67 is formed from materials and by techniques that are substantially the same as those used for forming dielectric 52.

FIG. 14 through FIG. 17 illustrate some steps in an alternate embodiment of a method of forming an electrical contact for a semiconductor device 70. This description references all of FIGS. 14–17. In some cases, it is desirable to form a bump pad that will subsequently be used to receive a solder ball or solder bump.

Figure 14:
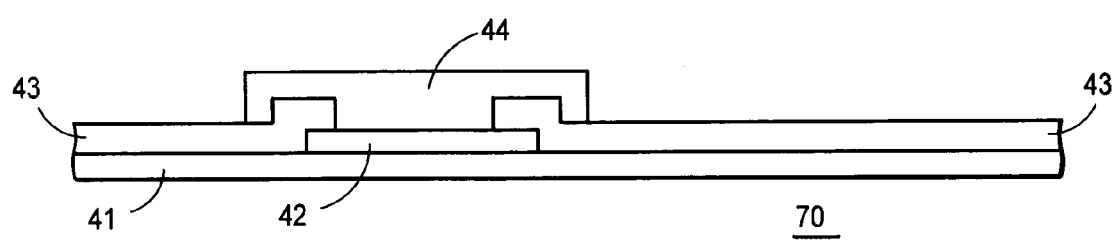
FIG. 14 through FIG. 17 illustrate some steps in an alternate embodiment of a method of forming an electrical contact for a semiconductor device in accordance with the present invention.
Figure 15:
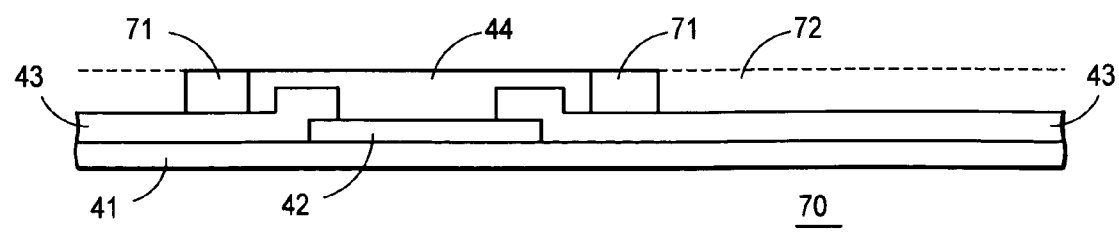

Referring now to FIG. 14, in order to form a bump pad connector 44 is formed on platform 42. Thereafter, as shown in FIG. 15 a pad conductor 71 is formed using the methods used for forming routing conductor 47 in FIG. 6. A mask 72 that is similar to mask 48 is used for forming conductor 71. Conductor 71 is formed from the same materials as conductor 47.

Figure 16:
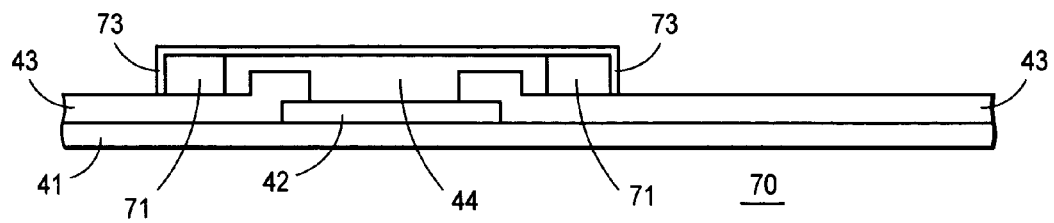

Referring to FIG. 16, an encasing conductor 73 is formed to cover exposed portions of connector 44 and conductor 71. Conductor 73 is formed using the same materials and method as encasing conductor 49. Forming conductor 73 on connector 44 and conductor 71 strengthens the bump pad formed by the structure of connector 44 and conductors 71 and 73.

Figure 17:
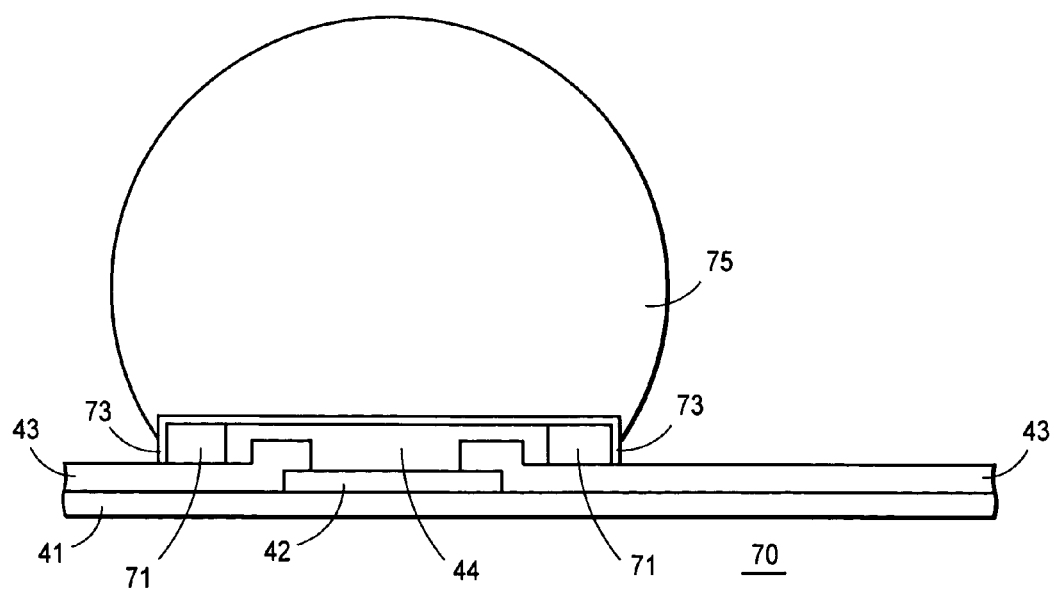

Referring to FIG. 17, subsequently a solder ball is positioned on the bump pad and reflowed form a solder bump 75. The solder ball is reflowed by methods that are well known to those skilled in the art. The structure of connector 44 and conductors 71 and 73 improve the reliability of the combined structure of the bump pad and solder bump 75.

In view of all of the above, it is evident that a novel device and method is disclosed. Included, among other features, is using electroless plating to form an interface connector on a connection platform of a semiconductor device. Using electroless plating reduces the cost of the semiconductor device. Also, screen-printing routing conductors and dielectrics onto the semiconductor device further reduce the manufacturing costs.

While the invention is described with specific preferred embodiments, it is evident that many alternatives and variations will be apparent to those skilled in the semiconductor arts.

The invention claimed is:

1. A method of forming an electrical contact for a semiconductor device comprising:

providing a semiconductor substrate having a contact pad on a surface of the semiconductor substrate and having a first dielectric on the surface juxtaposed to the contact pad;

applying a first conductor onto the contact pad;

forming a second conductor juxtaposed to and electrically contacting the first conductor;

applying a third conductor onto at least a portion of the first conductor and on at least a portion of the second conductor; and leaving the third conductor on at least a portion of the second conductor.

2. The method of claim 1 wherein applying the first conductor onto the contact pad includes applying the first conductor by a method that is devoid of sputtering or electroplating.

3. The method of claim 2 wherein applying the first conductor by a method that is devoid of sputtering or electroplating includes applying the first conductor by electroless plating.

4. The method of claim 2 wherein applying the first conductor by a method that is devoid of sputtering or electroplating includes applying the first conductor that is one of nickel-gold, or nickel-palladium-gold, or copper-nickel-gold.

5. The method of claim 1 wherein forming the second conductor juxtaposed to and electrically contacting the first conductor includes applying the second conductor by a method that is devoid of sputtering or electroplating.

6. The method of claim 5 wherein applying the second conductor by the method that is devoid of sputtering or electroplating includes screen-printing the second conductor.

7. The method of claim 1 further including screen-printing a second dielectric covering at least a portion of the third conductor and having an opening that exposes a portion of the third conductor.

8. The method of claim 7 wherein screen-printing the second dielectric includes screen-printing an organic dielectric layer.

9. The method of claim 1 wherein forming the second conductor juxtaposed to and electrically contacting the first conductor includes screen-printing a second dielectric layer and forming the second conductor on the second dielectric layer.

10. The method of claim 1 wherein providing the semiconductor substrate having the contact pad on the surface of the semiconductor substrate and having the first dielectric on the surface juxtaposed to the contact pad includes providing the first dielectric that includes an oxide of silicon.

\* \* \* \* \*